United States Patent
Harvey

(10) Patent No.: US 10,749,429 B2
(45) Date of Patent: Aug. 18, 2020

(54) METHODS AND SYSTEMS OF REDUCING CHARGE PUMP SUBSTRATE NOISE

(71) Applicant: Linear Technology LLC, Milpitas, CA (US)

(72) Inventor: Barry Harvey, Los Altos, CA (US)

(73) Assignee: Linear Technology LLC, Milpitas, CA (US)

( * ) Notice: Subject to any disclaimer, the term of this patent is extended or adjusted under 35 U.S.C. 154(b) by 363 days.

(21) Appl. No.: 15/445,926

(22) Filed: Feb. 28, 2017

(65) Prior Publication Data
US 2018/0248476 A1 Aug. 30, 2018

(51) Int. Cl.
*H02M 3/07* (2006.01)
*H03K 17/16* (2006.01)

(52) U.S. Cl.
CPC .............. *H02M 3/07* (2013.01); *H03K 17/16* (2013.01); *H03K 17/164* (2013.01)

(58) Field of Classification Search
CPC ...... H02M 3/07; H02M 3/073; H03K 17/164; H03K 19/01721
See application file for complete search history.

(56) References Cited

U.S. PATENT DOCUMENTS

| | | | |
|---|---|---|---|
| 5,398,318 A * | 3/1995 | Hiraishi | H03K 17/164 326/82 |
| 7,339,409 B2 * | 3/2008 | Choi | G11C 7/02 327/108 |
| 7,368,952 B2 * | 5/2008 | Ojiro | H03K 17/164 326/86 |
| 7,688,131 B2 | 3/2010 | Hsieh et al. | |
| 8,461,910 B2 | 6/2013 | Nadimpalli | |
| 8,879,312 B2 * | 11/2014 | Tsukada | G11C 5/145 365/148 |
| 9,184,623 B1 | 11/2015 | Cical et al. | |
| 2003/0034846 A1 | 2/2003 | Fan | |
| 2005/0104651 A1 | 5/2005 | Hashimoto | |
| 2007/0290728 A1 | 12/2007 | Tsai | |
| 2009/0039947 A1 | 2/2009 | Williams | |
| 2011/0204724 A1 | 8/2011 | Verma et al. | |

(Continued)

FOREIGN PATENT DOCUMENTS

| | | |
|---|---|---|
| CN | 204131377 U | 1/2015 |
| CN | 104467796 A | 3/2015 |

(Continued)

OTHER PUBLICATIONS

PCT/US2017/023409 "Invitation to Pay Additional Fees" dated May 11, 2017, 2 pages.

(Continued)

*Primary Examiner* — Jung Kim
(74) *Attorney, Agent, or Firm* — Knobbe, Martens, Olson & Bear, LLP

(57) ABSTRACT

Methods and systems of reducing a substrate noise in a charge pump having a flying capacitor are provided. An input node of the flying capacitor is pre-charged at a first slew rate. The input node of the flying capacitor is charged at a second slew rate that is faster than the first slew rate. The input node of the flying capacitor is pre-discharged at a third slew rate. The input node of the flying capacitor is discharged at a fourth slew rate that is faster than the first slew rate.

8 Claims, 3 Drawing Sheets

(56) References Cited

U.S. PATENT DOCUMENTS

2013/0265354 A1 10/2013 Watanabe
2018/0248476 A1 8/2018 Harvey

FOREIGN PATENT DOCUMENTS

| CN | 106341041 A | 1/2017 |
|---|---|---|
| JP | 2005-151777 A | 6/2005 |
| JP | 2009-081984 A | 4/2009 |
| JP | 2011-223829 A | 11/2011 |
| JP | 2013-162723 A | 8/2013 |
| JP | 2013-215961 A | 10/2013 |
| JP | 2014-064403 A | 4/2014 |
| JP | 2015-192496 A | 11/2015 |

OTHER PUBLICATIONS

PCT/US2017/023409 International Search Report and Written Opinion dated Jul. 10, 2017, 10 pages.
Decision of Rejection with Translation Issued for Japanese Application No. 2018-559211 dated Jan. 27, 2020 in 8 pages.
Office Action with Translation Issued for Chinese Application No. 201780025879.7 dated Dec. 12, 2019 in 10 pages.
Office Action with Translation Issued for Japanese Application No. 2018-559211 dated Oct. 15, 2019 in 10 pages.

\* cited by examiner

METHODS AND SYSTEMS OF REDUCING CHARGE PUMP SUBSTRATE NOISE

BACKGROUND

Technical Field

This disclosure generally relates to charge pumps, and more particularly, to charge pumps with reduced substrate noise.

Description of Related Art

In recent years, there has been a constant effort to improve performance, add additional features, reduce cost, and occupy less real estate in semiconductor integrated circuits (ICs). Consequently, the speed of circuits is progressively increasing, ICs are becoming more densely packed, and more circuit blocks are introduced that share a common substrate.

One challenge with these advanced digital, mixed signal, or analog ICs is to minimize noise coupling between various parts of the system to avoid degraded performance or even malfunctioning. Coupling caused by parasitics can lead to unreliable performance of the IC. For example, in mixed-signal circuits, both sensitive analog circuits and high frequency digital circuits that are a source of noise may be present on a same IC, leading to undesired signal coupling between these two types of circuits via the conductive substrate. The more densely packed these circuits are, the more pronounced the substrate noise issue becomes.

An example high frequency and high power circuit is a charge pump, which is a DC to DC converter that uses capacitors as energy storage elements to provide a lower or higher voltage level from a reference input. A charge pump can introduce mixed-signal noise coupling via a common node, such as the substrate. The high frequency switching operations of a charge pump cause fluctuations in the underlying substrate voltage, which spreads through the common substrate causing variations in the substrate potential, affecting various components of the IC, including the sensitive analog section.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Overview

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings. Some embodiments may be practiced with additional components or steps and/or without all of the components or steps that are described.

The methods and circuits disclosed herein generally relate to methods and circuits of providing low noise charge pumps. More particularly, the present disclosure describes active charge pumps that have a reduced substrate noise. A charge pump uses switching devices to control a voltage across a capacitor. In this regard, multiple stages may be used to progressively increase a reference voltage from stage to stage. The capacitor used in each stage is sometimes referred to as a "flying capacitor," which is cycled between a first supply (e.g., Vin) and a second supply (e.g., ground). Flying capacitors generally have parasitic capacitance to ground (e.g., when used as an external device) or to the substrate (e.g., when integrated on a chip). This parasitic capacitance acts as a conduit for coupling noise to other circuit components that share the same ground and/or substrate.

Figures 1A, 1B:
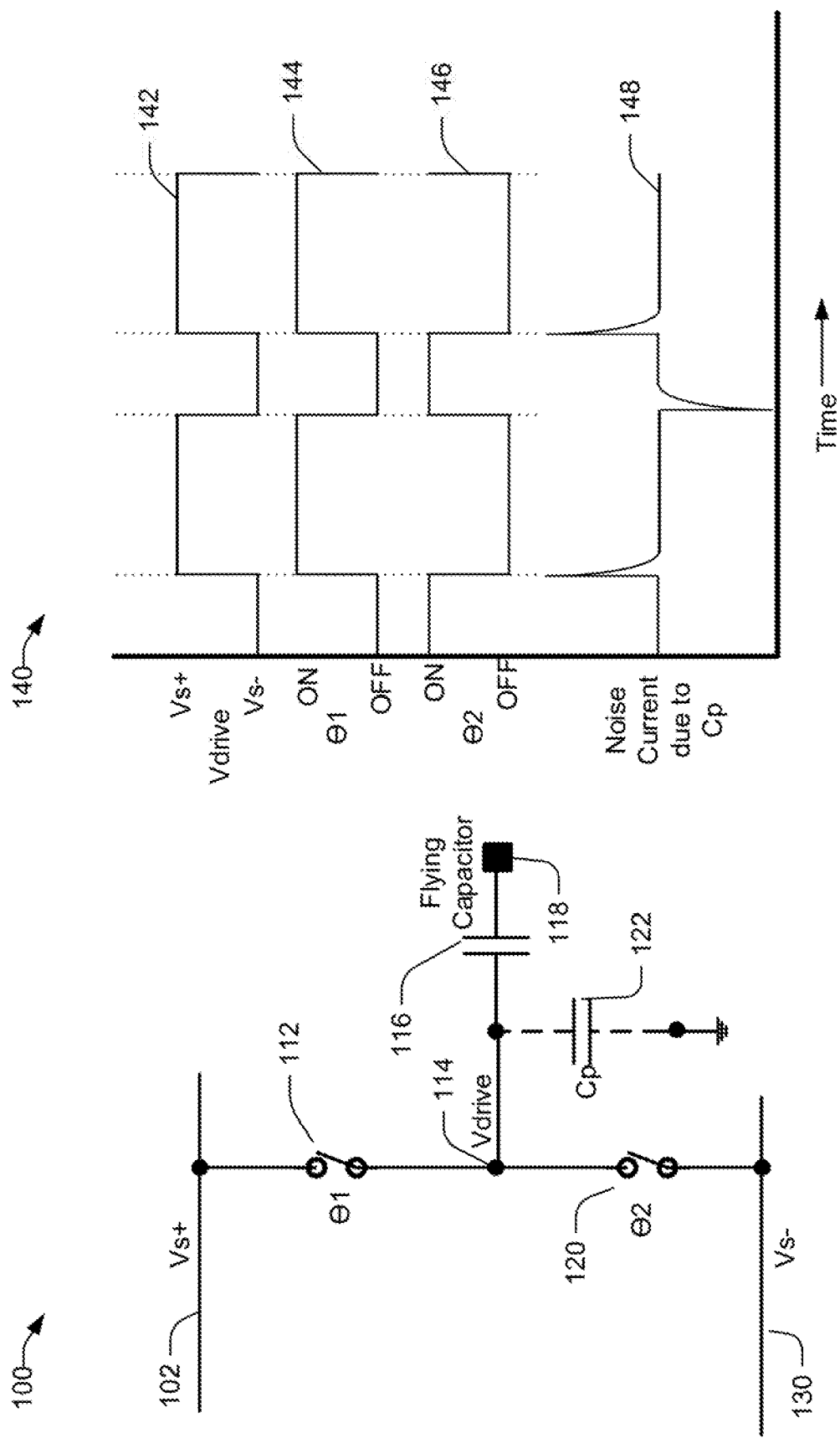
FIG. 1A illustrates a typical charge pump stage.
FIG. 1B illustrates several waveforms related to the operation of the charge pump stage of FIG. 1A.

Reference now is made to FIG. 1A, which illustrates a charge pump stage 100 as may be found in various typical charge pumps. Charge pump stage 100 includes a flying capacitor 116, which has a first node ($V_{drive}$) 114. There is a first switch θ1 (112) coupled between the first voltage supply ($V_{S+}$) at node 102 and $V_{drive}$ 114, and a second switch θ2 (120) coupled between the second voltage supply ($V_{S-}$) at node 130 and $V_{drive}$ 114. There is a parasitic capacitance $C_p$ 122 between $V_{drive}$ 114 and the substrate terminal. The substrate terminal is generally connected to ground or an external supply. The parasitic capacitance $C_p$ 122 represents the total parasitic capacitance at the $V_{drive}$ node 114, which may include the parasitic capacitance of the flying capacitor 116, the first switch 112, the second switch 120, wiring parasitics at node 114, etc., as well as any parasitic at node 118. In one estimate, the parasitic capacitance 122 may be ⅒ to ⅕ that of the actual flying capacitor 116, which may be in the nano-farad range.

Reference now is made to FIG. 1B, which illustrates several waveforms related to the operation of the charge pump stage 100 of FIG. 1A. The $V_{drive}$ node 114 is cycled between a first voltage supply ($V_{S+}$) at node 102 and a second voltage supply ($V_{S+}$) at node 130, as illustrated by waveform 142. To that end, when switch θ1 112 is ON, a path is created between $V_{S+}$ at node 102 and $V_{drive}$ 114 to charge the flying capacitor 116, as illustrated by waveform 144. The flying capacitor 116 is discharged through the switch θ2 120. Thus, when the switch θ2 120 is ON, a path is created between the second voltage supply $V_{S-}$ at node 130 and the $V_{drive}$ node 114, as illustrated in waveform 146. The voltage transitions on the flying capacitor 116 are usually very fast, one nanosecond risetime or less. Accordingly, the transient currents driven by the switches θ1 112 and θ2 120 are also very fast. The resulting di/dt creates large voltage transients through the substrate connecting wire inductance. The resulting noise current is illustrated in waveform 148 and provided by equation 1 below:

$$I_{Noise} = Cp \frac{dv}{dt} \quad \text{[Eq. 1]}$$

Accordingly, the noise current $I_{Noise}$ is a function of the parasitic capacitance $C_p$ 122 and the change in voltage dv at the $V_{drive}$ node 114. The current spikes 148 due to the sharp voltage edges of the flying capacitor 116 are generally difficult to suppress.

The applicant has identified that by using a configuration and a timing sequence discussed herein, the rush of current to/from the substrate during a charge/discharge operation can be actively controlled, thereby reducing the noise floor of the substrate of a charge pump stage. To that end, an input node of the flying capacitor is pre-charged at a first slew rate. The input node of the flying capacitor is charged at a second slew rate that is faster than the first slew rate but has a small voltage change at Vdrive. The input node of the flying capacitor is pre-discharged at a third slew rate. The input node of the flying capacitor is discharged at a fourth slew rate that is faster than the first slew rate but also of small magnitude. By virtue of the methods and architectures discussed herein, the substrate noise in a charge pump having a flying capacitor is reduced.

Example Implementation

Figure 2:
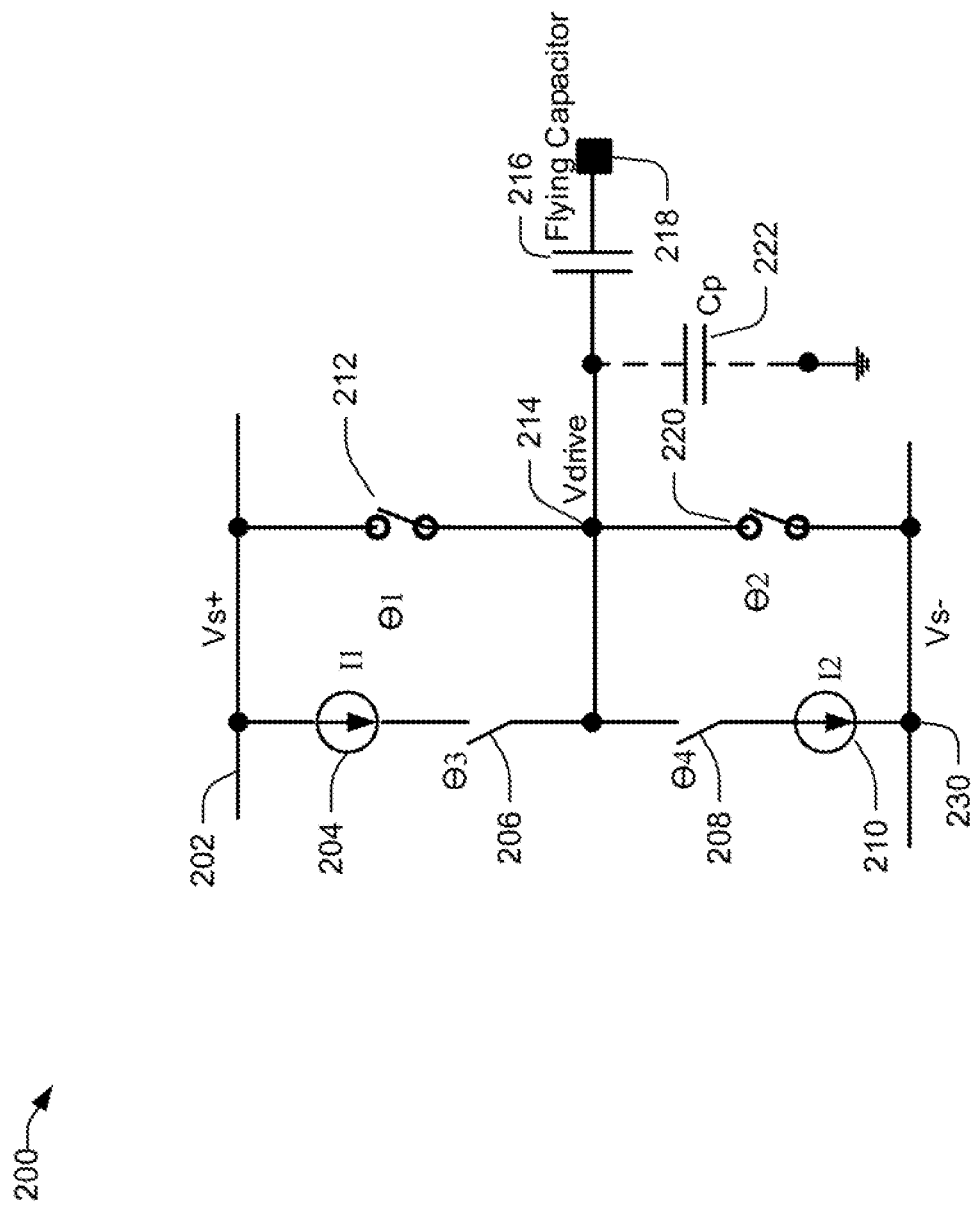
FIG. 2 illustrates a charge pump stage 200, consistent with an illustrative embodiment.

FIG. 2 illustrates a charge pump stage 200, consistent with an illustrative embodiment. Charge pump stage 200 includes a flying capacitor 216, which is coupled between the $V_{drive}$ node 214 and an output 218. In various embodiments, the output node 218 may be coupled to one or more charge pump stages to achieve a desired output voltage.

There is a first switch θ1 (212), sometimes referred to herein as the drive switch, coupled between the first voltage supply ($V_{S+}$) at node 202 and the $V_{drive}$ node 214, and a second switch θ2 (120), sometimes referred to herein as the discharge switch, coupled between the second voltage supply ($V_{S-}$) at node 230 and the $V_{drive}$ 214. The first switch θ1 (212) is configured to quickly charge the $V_{drive}$ node 214, whereas the second switch θ2 (220) is configured to quickly discharge the $V_{drive}$ node 214.

In one embodiment, there is a first current source 204 coupled to the first voltage supply ($V_{S+}$) at node 202 and a second current source 210 coupled to the second voltage supply ($V_{S-}$). A third switch θ3 (206) is coupled between the first current source $I_1$ (204) and the $V_{drive}$ node 214. A fourth switch θ4 (208) is coupled between the $V_{drive}$ node 214 and the second current source $I_2$ (210).

The third switch θ3 (206) is configured to pre-charge the $V_{drive}$ node 214 at a slew rate that is substantially slower than that caused by the first switch θ1. For instance, the θ3 period can be one-fourth the clock period. If the clock frequency were 1 MHz, the θ3 period would be 250 nsec, much slower than a 1 nsec uncontrolled edge. The fourth switch θ4 (208) is configured to pre-discharge the $V_{drive}$ node 214 at a slew rate that is substantially slower than that caused by the second switch θ2 (220). In one embodiment, the slew rate of the third switch θ3 (206) and the fourth switch θ4 (208) are substantially similar. Equation 2 below provides the guidelines for the first current source 204 and the second current source 210, for an example embodiment.

$$I_1 \text{ and } I_2 \geq 4 \times C_p (V_{S+} - V_{S-}) \times F_{osc} \quad [\text{Eq. 2}]$$

Where:
$I_1$ is the current through the first current source 204;
$I_2$ is the current through the second current source 210;
$C_p$ is the parasitic capacitance 222; and
$F_{osc}$ is the inverse of the period of switches θ1 (212) and θ2 (220).

By virtue of the relationship in equation 2 above, the charge pump stage 200 provides a pre-charge and a pre-discharge having a slew rate that is substantially slower than the slew rate of the charge switch θ1 (212) and the discharge switch θ2 (220), respectively.

In one embodiment, a separate current source $I_1$ 204 and/or $I_2$ 208 are not necessary. For example, the switch θ3 (204) may be configured such that it provides a reduced current between the first voltage supply $V_{S+}$ and the Vdrive node 214 that is consistent with equation 2 above. Similarly, the switch θ4 (208) may be configured such that it provides a reduced current between the second voltage supply $V_{S-}$ and the Vdrive node 214 consistent with equation 2 above. For example, if a field effect transistor is used as a switch, the width/length of the transistor may be adjusted to achieve the desired current through the transistor. It is believed that those skilled in the art are knowledgeable about the sizing of the different types of switches to achieve the desired current. Accordingly, the sizing of the switches is not discussed herein for brevity.

As discussed previously, there is a parasitic capacitance $C_p$ 222 between $V_{drive}$ node 214 and the substrate terminal. While the parasitic capacitance $C_p$ 222 has been illustrated by way of example only and not by way of limitation to ground, in various scenarios, the parasitic capacitance $C_p$ 222 may be to any other node, such as the substrate, the first supply ($V_{S+}$), the second supply ($V_{S-}$), or any other node of the charge pump stage 200.

The parasitic capacitance $C_p$ 222 represents the total parasitic capacitance at the $V_{drive}$ node 214, which may include the parasitic capacitance of the flying capacitor 216, the first switch 212, the second switch 220, wiring parasitics at node 214, wiring parasitics at node 218, etc.

Figure 3:
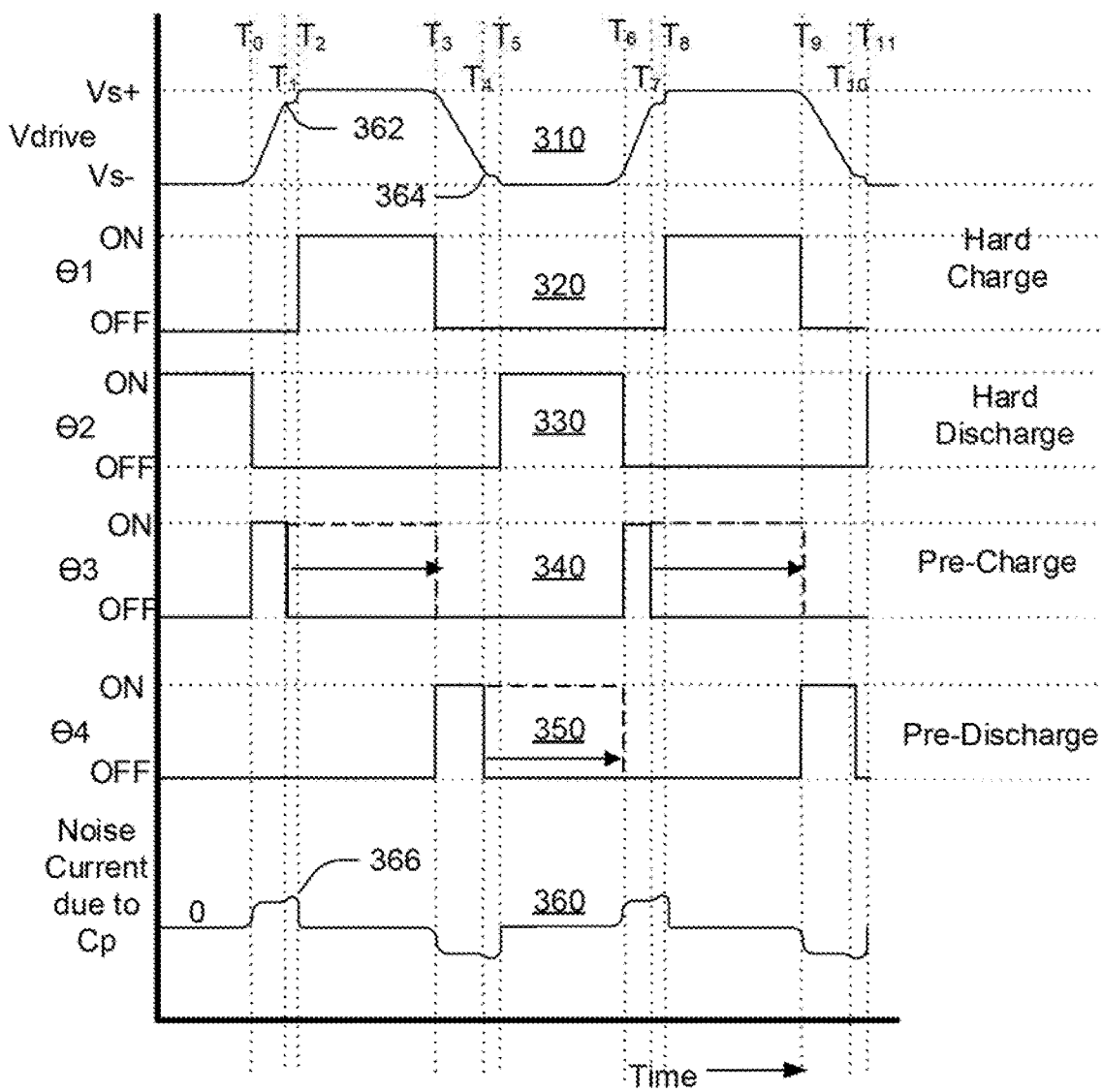
FIG. 3 illustrates several waveforms related to the operation of the charge pump stage of FIG. 2, consistent with an illustrative embodiment.

Reference now is made to FIG. 3, which illustrates several waveforms related to the operation of the charge pump stage 200 of FIG. 2, consistent with an illustrative embodiment. The $V_{drive}$ node 214 is cycled between a level provided by a first voltage supply ($V_{S+}$) at node 202 and a second voltage supply ($V_{S-}$) at node 230, as illustrated by waveform 310. Significantly, the charge pump stage 200 is configured in such a way to prevent a current spike to the ground or substrate. To that end, each hard charge by the switch θ1 (212) is preceded by a pre-charge via switch θ3 (206). Similarly, each hard discharge by switch θ2 (220) is preceded by a pre-discharge by switch θ4 (208). Put differently, each charge cycle includes a pre-charge and a hard charge, and every discharge cycle includes a pre-discharge and a hard discharge.

For example, the $V_{drive}$ node 214 is pre-charged to a predetermined voltage level at a first slew rate by turning ON switch θ3 (206), as indicated by waveform 340. Accordingly, a path is created between the first current source 204 and the $V_{drive}$ node 214, thereby pre-charging the $V_{drive}$ node 214, having a parasitic capacitance $C_p$ 222, to a predetermined voltage, which may be at or slightly below $V_{S+}$, due to the effective resistance drop of the switch θ3 (206), which in turn is due to flying capacitor 216 charge current, as indicated by level 362.

In various embodiments, during the charge cycle, the switch θ3 (206) is turned ON before the switch θ1 (212) is turned ON. The switch θ1 may be kept ON while switch θ3 is ON (see dotted line of waveform 340 and its relationship to waveform 320) with little change in waveform 310. Thus, at $T_0$, the switch θ3 (206) is ON until $T_1$ to $T_3$. At $T_2$, the switch θ1 is turned ON and kept ON until $T_3$. Thus, the pre-charge may have a time window that overlaps with the hard charge.

Similarly, during a discharge cycle, the $V_{drive}$ node 214 is pre-discharged to a second predetermined voltage (at or below $V_{S-}$) at a second slew rate, by turning ON switch θ4 (208), as indicated by waveform 350. Accordingly, a path is created between the second current source 210 and the $V_{drive}$ node 214, thereby pre-discharging the $V_{drive}$ node 214 to a second predetermined voltage, which may be at or slightly above $V_{S-}$, as indicated by level 364. Thus, at $T_3$ the switch θ4 (208) is turned ON. In various embodiments, the switch θ4 (208) is kept ON until $T_4$ to $T_6$. Put differently, the switch θ4 (208) is turned OFF before the second switch θ2 (220) is turned ON, or kept ON until the next pre-charge cycle begins at $T_6$ (see dotted line in waveform 350).

The slew rate during a pre-charge is provided by equation 3 below.

$$\frac{dv}{dt} = \frac{I1}{Cp} \qquad [\text{Eq. 3}]$$

Where:
dv is the change in voltage at the $V_{drive}$ node 214;
dt is the time for the voltage change at the $V_{drive}$ node 214;
$I_1$ is the current through the first current source 204; and
$C_p$ is the parasitic capacitance 222.

In one embodiment, the pre-charge current provided by the first current source 204 is relatively small (e.g., in the order μA or tens of μA), thereby providing a slow slew rate). In contrast, the current provided through the first switch θ1 (212) may be up to a thousand times larger, providing a second slew rate that may be largely uncontrolled and significantly faster than that of the pre-charge. Accordingly, by using the pre-charge, the injected substrate current is not only smaller (see a relatively small bump 366 during a hard charge) but also spread over time, as indicated by waveform 360. The pre-discharge operation is similar to the above and therefore not repeated here for brevity. By virtue of the pre-charge and the pre-discharge discussed herein, the substrate noise floor is reduced.

It should be noted that, in one embodiment, due to the slow slew rate, much charge is not transferred to the flying capacitor 216 via the third switch θ3 (206) during a pre-charge operation. Thus, the switch θ1 (212) performs the charge transfer to the flying capacitor 216 during a charge operation via switch θ1 (212). In this regard, since the $V_{drive}$ node 214 almost arrived (see level 362 in waveform 310) at $V_{S+}$ level, the voltage at the $V_{drive}$ node 214 jumps to the $V_{S+}$ level when the switch θ1 is turned ON at $T_2$. Switches θ4 and θ2 provide similar waveforms during a discharge cycle.

CONCLUSION

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently.

For example, in various embodiments, a switch may be in the form of a field effect transistor (FET, such as a PFET, NFET, and/or JFET), bipolar device (e.g., NPN and/or PNP), any combination thereof, or any other suitable active or passive device based on the particular implementation. It is believed that those skilled in the art are familiar with the structure and general operation and implementation of a switch based on different technologies.

Unless otherwise stated, all measurements, values, ratings, positions, magnitudes, sizes, and other specifications that are set forth in this specification, are approximate, not exact. They are intended to have a reasonable range that is consistent with the functions to which they relate and with what is customary in the art to which they pertain.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A charge pump, comprising:
    a flying capacitor coupled between a drive node and an output;
    a first drive switch coupled between a first supply and the drive node and operative to charge the flying capacitor;
    a second drive switch coupled between a second supply and the drive node and operative to discharge the flying capacitor;
    a third switch coupled between the first supply and the drive node and operative to pre-charge the drive node; and
    a fourth switch coupled between the second supply and the drive node and operative to pre-discharge the drive node, wherein a slew rate of the third switch is slower than a slew rate of the first switch.

2. The charge pump of claim 1, wherein the third switch is configured to be turned ON before the first switch is turned ON.

3. The charge pump of claim 2, wherein the third switch is configured to be kept ON while the first switch is ON.

4. The charge pump of claim 1, wherein the fourth switch is configured to be turned ON before the second switch is turned ON.

5. The charge pump of claim 4, wherein the fourth switch is configured to be kept ON while the second switch is ON.

6. The charge pump of claim 1, further comprising:
a first current source coupled between the first supply and the drive node; and
a second current source coupled between the second supply and the fourth switch.

7. The charge pump of claim 1, wherein a slew rate of the fourth switch is slower than a slew rate of the second switch.

8. The charge pump of claim 1, wherein a current $I_1$ through the third switch and a current $I_2$ through the second switch is based on:
a parasitic capacitance $C_p$ at the drive node;
the first supply Vs+;
the second supply Vs−; and
an inverse of a period of the first and second drive switches, wherein, $I_1$ and $I_2 \geq 4 \times C_p (V_{S+} - V_{S-}) \times F_{osc}$.

* * * * *